(12) United States Patent
Patterson (10) Patent No.: US 7,931,849 B2
(45) Date of Patent: Apr. 26, 2011

(54) NON-DESTRUCTIVE LASER OPTICAL INTEGRATED CIRCUIT PACKAGE MARKING

(75) Inventor: Joseph Martin Patterson, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 109 days.

(21) Appl. No.: 12/242,545

(22) Filed: Sep. 30, 2008

(65) Prior Publication Data

US 2009/0325322 A1 Dec. 31, 2009

Related U.S. Application Data

(63) Continuation-in-part of application No. 12/145,566, filed on Jun. 25, 2008.

(51) Int. Cl.
*B29C 35/08* (2006.01)
*H01L 21/66* (2006.01)
*B23K 26/00* (2006.01)

(52) U.S. Cl. .. 264/400; 264/482; 438/801; 257/E23.179

(58) Field of Classification Search ................ 264/400, 264/482; 257/797, E23.179; 438/401
See application file for complete search history.

(56) References Cited

U.S. PATENT DOCUMENTS

| | | | | |
|---|---|---|---|---|
| 5,063,280 A | * | 11/1991 | Inagawa et al. | 219/121.7 |
| 5,194,711 A | * | 3/1993 | Gaukroger | 219/121.67 |
| 5,353,498 A | * | 10/1994 | Fillion et al. | 29/840 |
| 5,722,161 A | * | 3/1998 | Marrs | 29/841 |
| 6,042,936 A | * | 3/2000 | Kempf | 428/323 |
| 6,239,482 B1 | * | 5/2001 | Fillion et al. | 257/678 |
| 6,346,296 B1 | * | 2/2002 | McCarthy et al. | 442/66 |
| 6,559,409 B1 | * | 5/2003 | Cadet | 219/121.68 |
| 7,071,024 B2 | * | 7/2006 | Towle et al. | 438/106 |
| 7,608,214 B2 | * | 10/2009 | Kuno et al. | 264/400 |
| 2005/0258530 A1 | * | 11/2005 | Vindasius et al. | 257/686 |
| 2006/0039419 A1 | * | 2/2006 | Deshi | 372/9 |
| 2006/0169677 A1 | * | 8/2006 | Deshi | 219/121.7 |
| 2008/0156780 A1 | * | 7/2008 | Voronov et al. | 219/121.69 |
| 2009/0160053 A1 | * | 6/2009 | Meyer et al. | 257/738 |
| 2009/0194516 A1 | * | 8/2009 | Deshi | 219/121.71 |

FOREIGN PATENT DOCUMENTS

WO WO2006040984 A1 * 4/2006

OTHER PUBLICATIONS

T. Nagauma et al. "Effect of particle size on light transmittance of glass particle dispersed epoxy matrix optical composite" Science Direct (1999), pp. 1-15.*

* cited by examiner

*Primary Examiner* — Kat Wyrozebski
*Assistant Examiner* — Nahida Sultana
(74) *Attorney, Agent, or Firm* — Law Offices of Gerald Maliszewski; Gerald Maliszewski (57) ABSTRACT

A method is provided for laser optically marking integrated circuit (IC) packages in a non-destructive manner. The method provides an IC die encapsulated as a package in a compound of glass spheres and epoxy. An acute angle is defined between a laser optical path and an IC package planar surface. The IC package surface is scanned with a laser, and in response to ablating the IC package surface, a legible mark on the planar surface.

12 Claims, 8 Drawing Sheets

FIG. 9

NON-DESTRUCTIVE LASER OPTICAL INTEGRATED CIRCUIT PACKAGE MARKING

RELATED APPLICATIONS

This application is a Continuation-in-Part of a pending application entitled, LASER OPTICAL PATHWAY DETECTION IN INTEGRATED CIRCUIT PACKAGING, invented by Joseph Patterson, Ser. No. 12/145,566, filed Jun. 25, 2008. This application is incorporated herein by reference.

BACKGROUND OF THE INVENTION

1. Field of the Invention

This invention generally relates to integrated circuit (IC) fabrication and, more particularly, to a method for non-destructively marking an IC package by avoiding inadvertent formed laser optical path through the IC package.

2. Description of the Related Art

IC devices are formed from a die of active semiconductor devices. The die can be mounted in a hybrid circuit, printed, circuit board (PCB), or a package. For environmental protection, the die may be covered by a passivation layer. However, a package is more typically used since it also dissipates heat and provides a lead system for electrical connections. There are many different types of packages including through-hole, surface mount device (SMD) dual/quad, and SMD area array packages.

Figure 1:
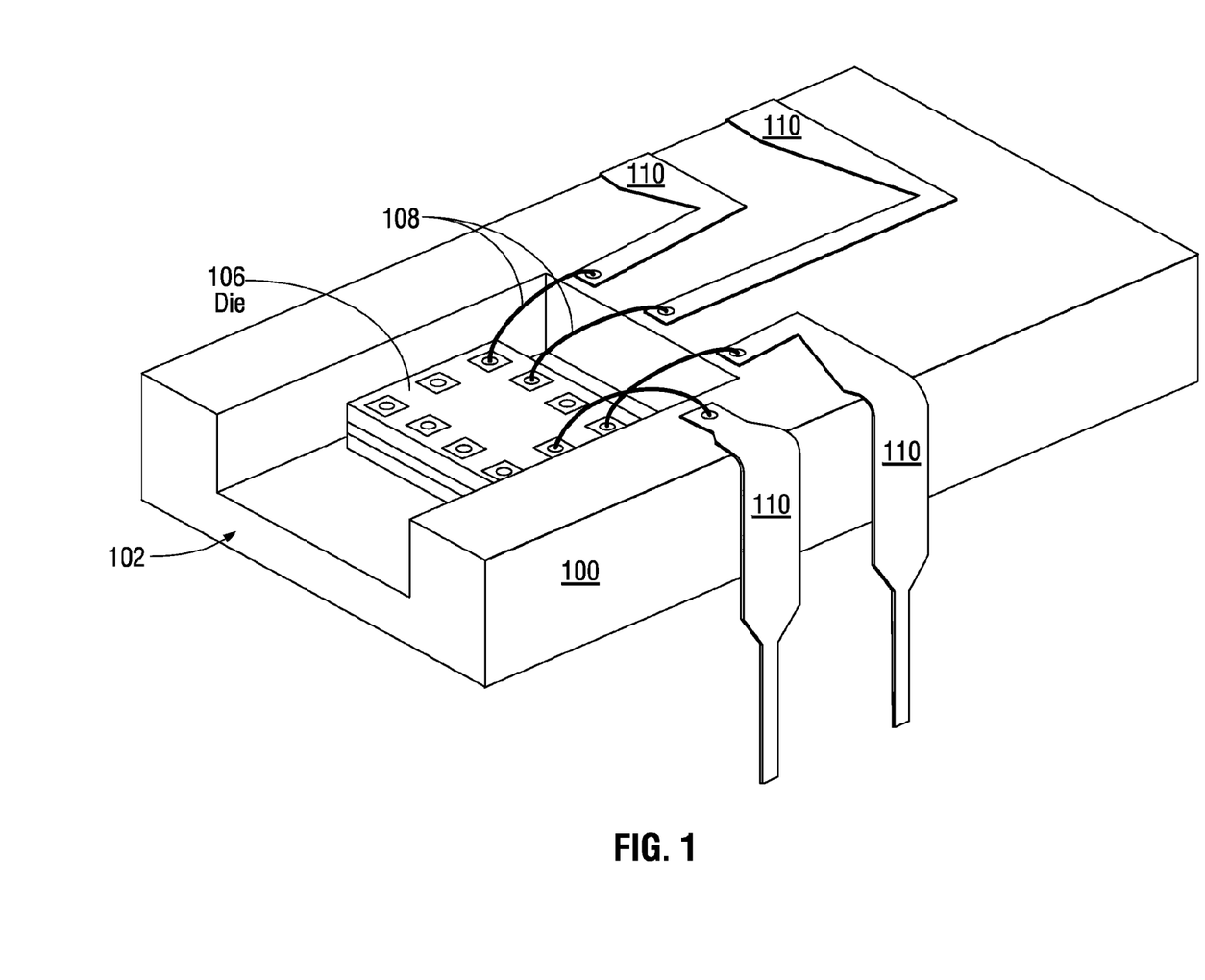
FIG. 1 is a perspective view of a dual in-line package (DIP) (prior art).

FIG. 1 is a perspective view of a dual in-line package (DIP) (prior art). It is common for a package body or lead frame 100 to have a die attach area 102. The die 103 has electrical contact pads on its top surface. Inner leads 108 connect pads on die top surface to outer leads or lead frames 110. Once the inner leads are bonded to the lead frames, the package is sealed with ceramic, in a metal can, or in a polyimide. Epoxy resins are also a common choice. Glass beads are commonly mixed in with the epoxy to reduce strain in the epoxy film during changes in temperature.

Optical beam induced current (OBIC) is a semiconductor analysis technique performed using laser signal injection. The technique induces current flow in the semiconductor sample through the use of a laser light source. This technique is used in semiconductor failure analysis to locate buried diffusion regions, damaged junctions, and gate oxide shorts.

The OBIC technique may be used to detect the point, at which a focused ion beam (FIB) milling operation in bulk silicon of an IC must be terminated. This is accomplished by using a laser to induce a photocurrent in the silicon, while simultaneously monitoring the magnitude of the photocurrent by connecting an ammeter to the device's power and ground. As the bulk silicon is thinned, the photocurrent increases as the depletion region of the well to substrate junction, is reached. FIB milling operations are terminated in a region below the well depth, so the device remains operational.

Figure 2:
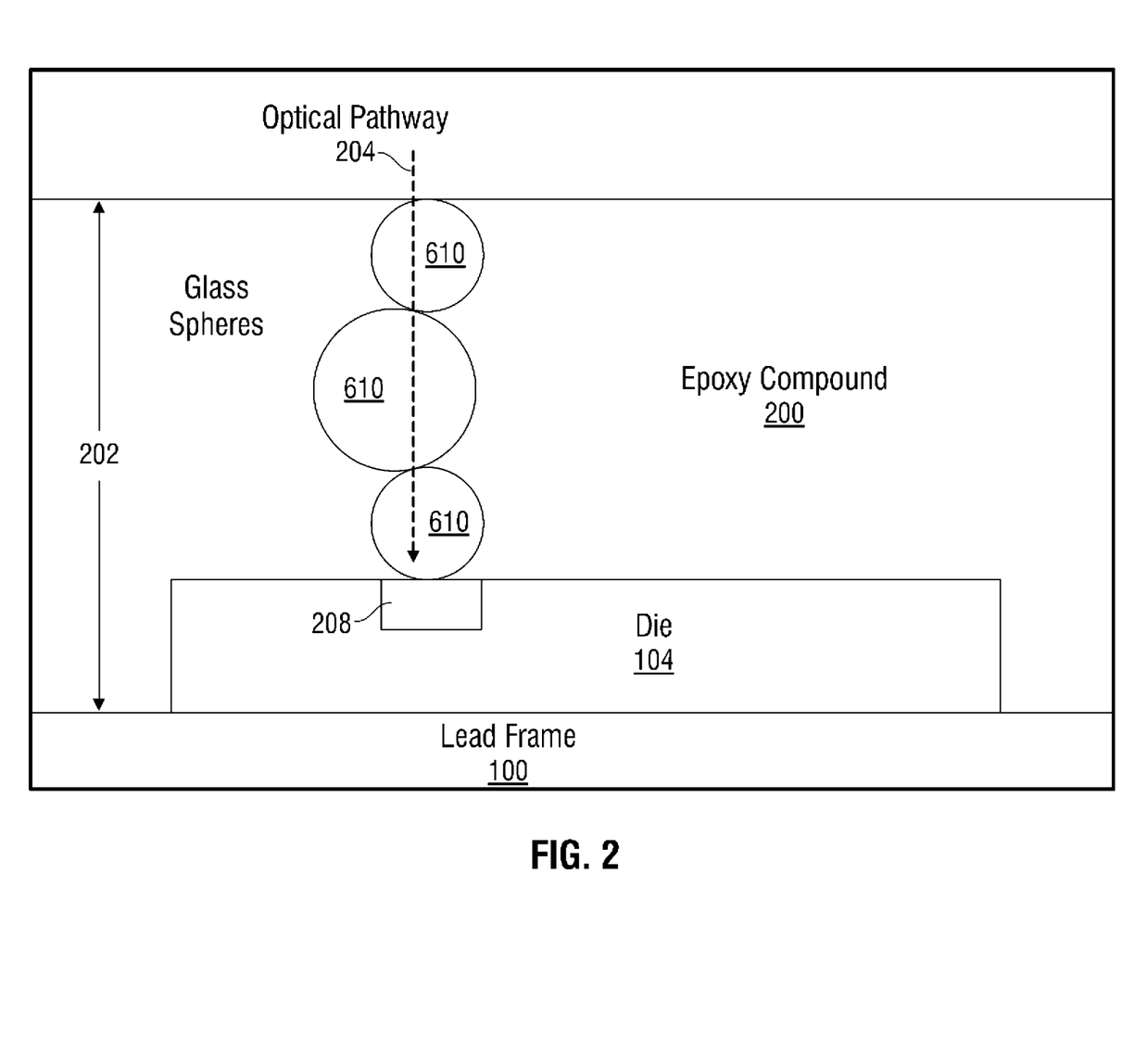
FIG. 2 is a partial cross-sectional view of an optical pathway formed through glass beads in an epoxy compound sealant.

FIG. 2 is a partial cross-sectional view of an optical pathway formed through glass beads in an epoxy compound sealant. The laser marking, or labeling by material ablation, of integrated circuits is routinely performed, using a $CO_2$ laser, directly on the package surface after the epoxy mold compound is applied. It has been reported in technical literature that an integrated circuit can he damaged using a laser for identification marking on the outside of the package. An optical path can be inadvertently formed by the alignment of the glass particles in the epoxy mold compound. During the marking process, a laser can follow the optical path to the die. If the laser energy is sufficient, metal lines on the die can be melted and shorted, or active semiconductor regions of the die can be damaged. As IC packages continue to decrease in size, the epoxy compound thicknesses inherently decrease, and the statistical probability of forming inadvertent optical paths through the glass particles increases.

It should he noted that the use of epoxy compounds with glass beads is an industry standard. The size and distribution of glass balls determines the flow characteristics, uniformity, and void formation. The glass balls "balance" other ingredients in the epoxy that have been developed and improved for years. The removal of glass balls from epoxy compounds would be a major complication for packaging assemblers and epoxy suppliers. Further, the use of materials other than glass balls would require the requalification of many IC packages.

The optical pathways caused by glass balls can potentially be identified through metallurgical cross-sectioning in multiple locations, and detailed examination of the cross-sections. However, this cross-sectioning process is tedious and labor intensive. Nondestructive investigation methods such as x-ray and acoustic microscopy cannot detect these optical pathways.

A means of detecting IC die regions susceptible to optical pathways was disclosed in parent application Ser. No. 12/145, 566. However, there is no known means of totally eliminating optical pathways as long as transparent glass spheres are used in thinly encapsulated packaging.

It would be advantageous if a method existed, to minimize the likelihood of uncovering optical paths when laser marking an IC package. It would he advantageous to minimize the likelihood of damage if an optical path is uncovered during marking, by increasing the length of the path or changing the path direction taken by the laser beam.

SUMMARY OF THE INVENTION

The present invention describes a method for laser marking an integrated circuit packages in a manner least likely to cause damage as a result of a laser inadvertently uncovering optical pathways to the die. Instead of creating a right-angle between the IC package surface, an acute angle is formed. Any uncovered pathway that is aligned with the laser beam will necessary have a longer length than right angle pathways. Since longer pathways are statistically less likely to occur than, shorter pathways, there is a lower probability of damaging the encapsulated IC die.

Accordingly, a method is provided for laser optically marking integrated circuit (IC) packages in a non-destructive manner. The method provides an IC die encapsulated as a package in a compound of glass spheres and epoxy. An acute angle is defined between a laser optical path and an IC package planar surface. The IC package surface is scanned with a laser, and in response to ablating the IC package surface, a legible mark on the planar surface.

In one aspect, the IC die is encapsulated with a first thickness of compound. Then, scanning the IC surface with a laser includes scanning the laser through optical pathways, formed from consecutively aligned glass spheres in the compound, having a path length greater than the first thickness. A typical IC package has a first plurality of optical paths with a first path length equal to the first thickness, but a second plurality of optical paths, less than the first plurality, having a second path, length greater than the first path length.

Additional details of the above-described method are provided below.

DETAILED DESCRIPTION

A new cause for the failure of integrated circuits was reported in a paper by Intel at the 2007 ISTFA conference, wherein damage to the encapsulated integrated circuit was induced during laser package marking due to local heating. As noted above, it is possible to form optical paths in an epoxy mold compound to the die surface, through the spheres of glass filler. The problem is becoming more critical as IC packages, and their epoxy compound thicknesses decrease in size.

To examine packages that may he susceptible to this failure mechanism, Optical Beam Induced Current (OBIC) and Thermally Induced Voltage Alteration (TIVA) laser imaging techniques can he used to electrically detect optical transmission through thin packages. The enclosed integrated circuit acts as a detector while the laser is scanned on the outside of the package. In one aspect, the TIVA laser causes some heating of the IC and the resultant resistance change is detected electronically through the leads of the device. The OBIC laser causes the generation of electron-hole pairs in the crystal silicon die that results in a current that is then detected as a voltage at the pins of the device. In some aspects, both lasers are used simultaneously.

Figure 3:
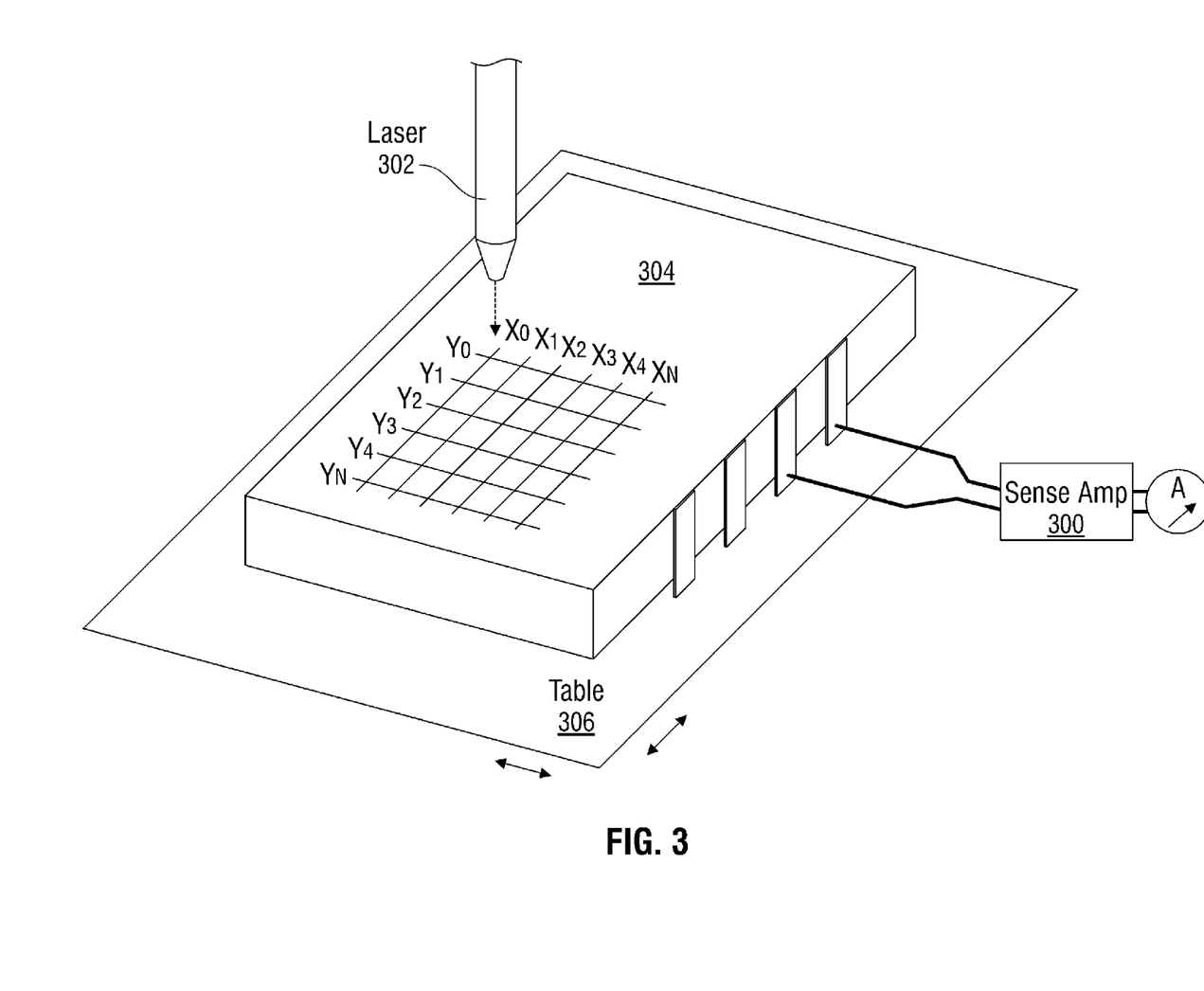
FIG. 3 depicts an exemplary system for detecting optical paths through an IC package.

FIG. 3 depicts an exemplary system for detecting optical paths through an IC package. Selected power pins from the IC are connected to a sense amp 300, as are the IC grounds. A laser 302 scans an area of an IC package 304 overlying the die (not shown). The scanning area is defined, by an x-y coordinate system. The IC package 304 is mounted on a movable table 308. Alternately, the IC package position is fixed and the laser moves. The scan pattern need not necessarily follow the x-y grid. In some aspects, only selected areas of the package surface over the die are scanned.

Figure 4:
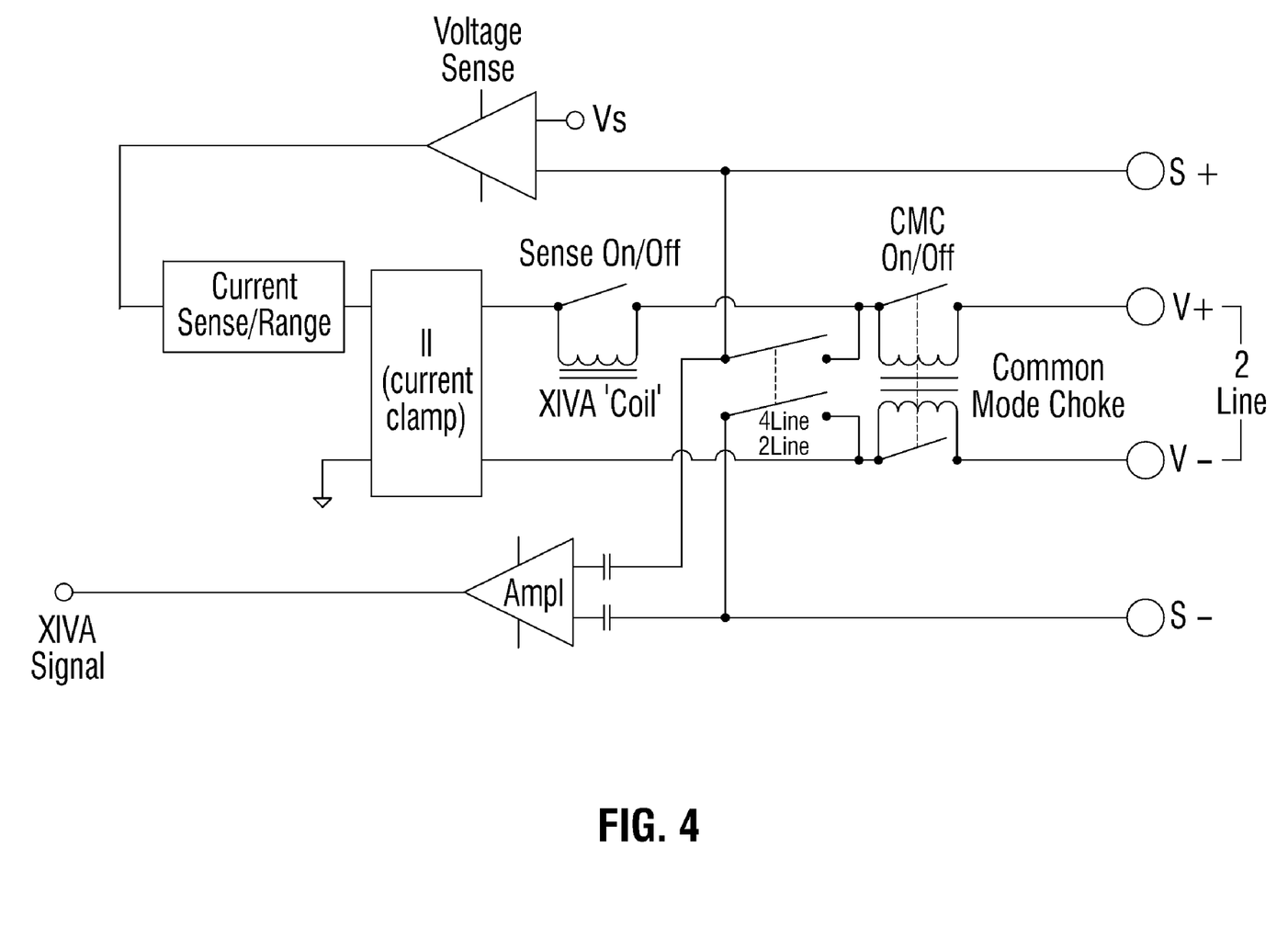
FIG. 4 is a detailed schematic of a sense amplifier.

FIG. 4 is a detailed schematic of a sense amplifier. The sense amplifier 400 connects lines V+ and S+ to IC power supply lines, while inputs V− and S− are typically connected to ground. In other aspects, the sense amplifier lines may be connected to signal inputs or signal outputs.

Imaging is performed through the top of the package with the epoxy compound intact. Electrical connections are made to the power supply pins of the device and those connections go to a current amplifier for video imaging the package surface as the OBIC laser is scanned. The OBIC laser has a 1065 nanometers wavelength and does not ablate the epoxy mold compound. However, glass spheres in the epoxy will pass that wavelength. Also, this wavelength will generate electron hole pairs in the semiconductor die and create a current if the laser light reaches the die surface (and the junctions are not covered by metal).

A package marking laser is more powerful than the OBIC laser. Typically, a marking laser is a $CO_2$ laser tunable in the wavelength of 8 to 12 microns, with a power in the range of 10-20 watts. Near Infrared lasers at wavelength of 1064 nanometers are also used. The marking necessarily ablates the mold compound to mark the package, and if it passes through the epoxy, it can cause damage to the die. In contrast, the optical path (OBIC or TIVA) testing lasers typically use a power of less than 100 milliwatts.

Figure 5:
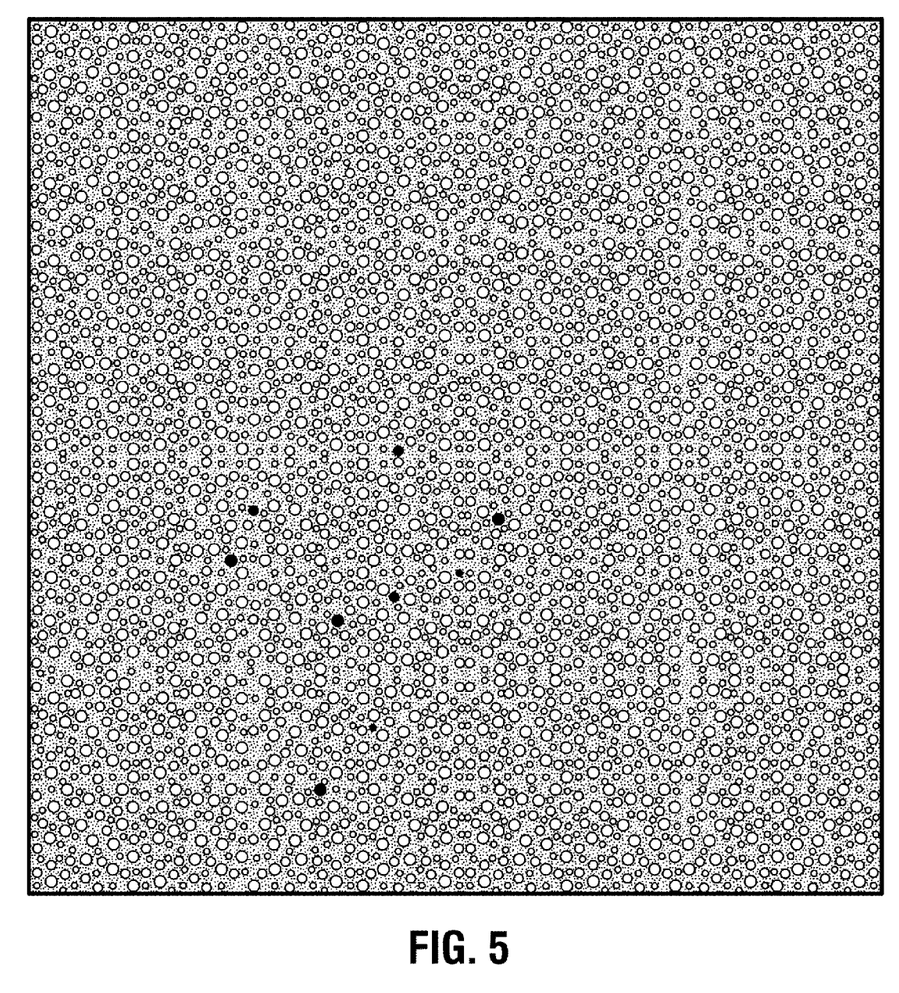
FIG. 5 is a diagram depicting an OBIC video image through the top of the package over the die area.

FIG. 5 is a diagram depicting an OBIC video image through the top of the package over the die area. The "clear" circular spots are the glass spheres in the epoxy mold compound reflecting the laser. The "solid" circular spots are locations where the OBIC laser has reached the die surface through a path of glass spheres, and caused a current in the semiconductor junctions. About nine sites are detected indicating a path to the IC.

Figure 6:
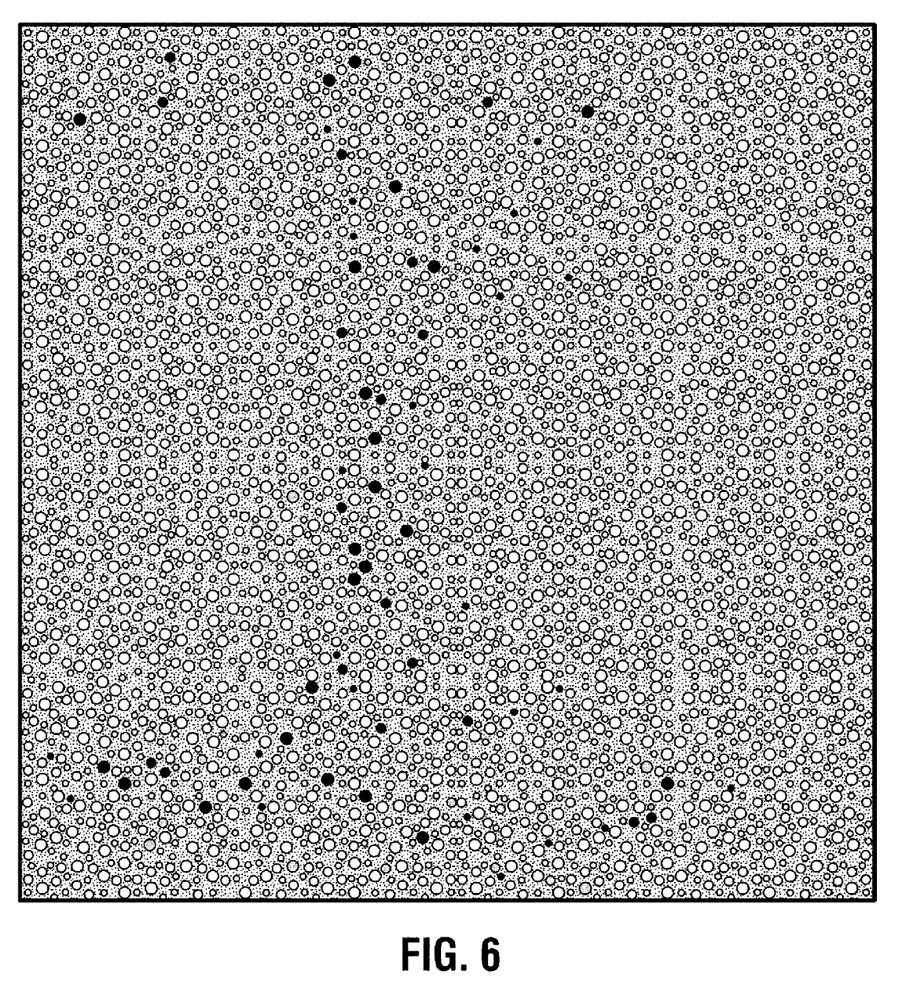
FIG. 6 is a diagram depicting a TIVA video image using a 1340 nanometer laser.

FIG. 6 is a diagram depicting a TIVA video image using a 1340 nanometer laser. The TIVA image is of the same device type viewed, in FIG. 5. The top of the package was polished to a depth that just removed the laser marking. The "solid" circular spots are locations where the laser went through glass filler particle optical path to the die surface, and was detected, electrically by the circuit. The "clear" circular spots are the glass filler particles on the surface showing up in the reflected image.

Figure 7:
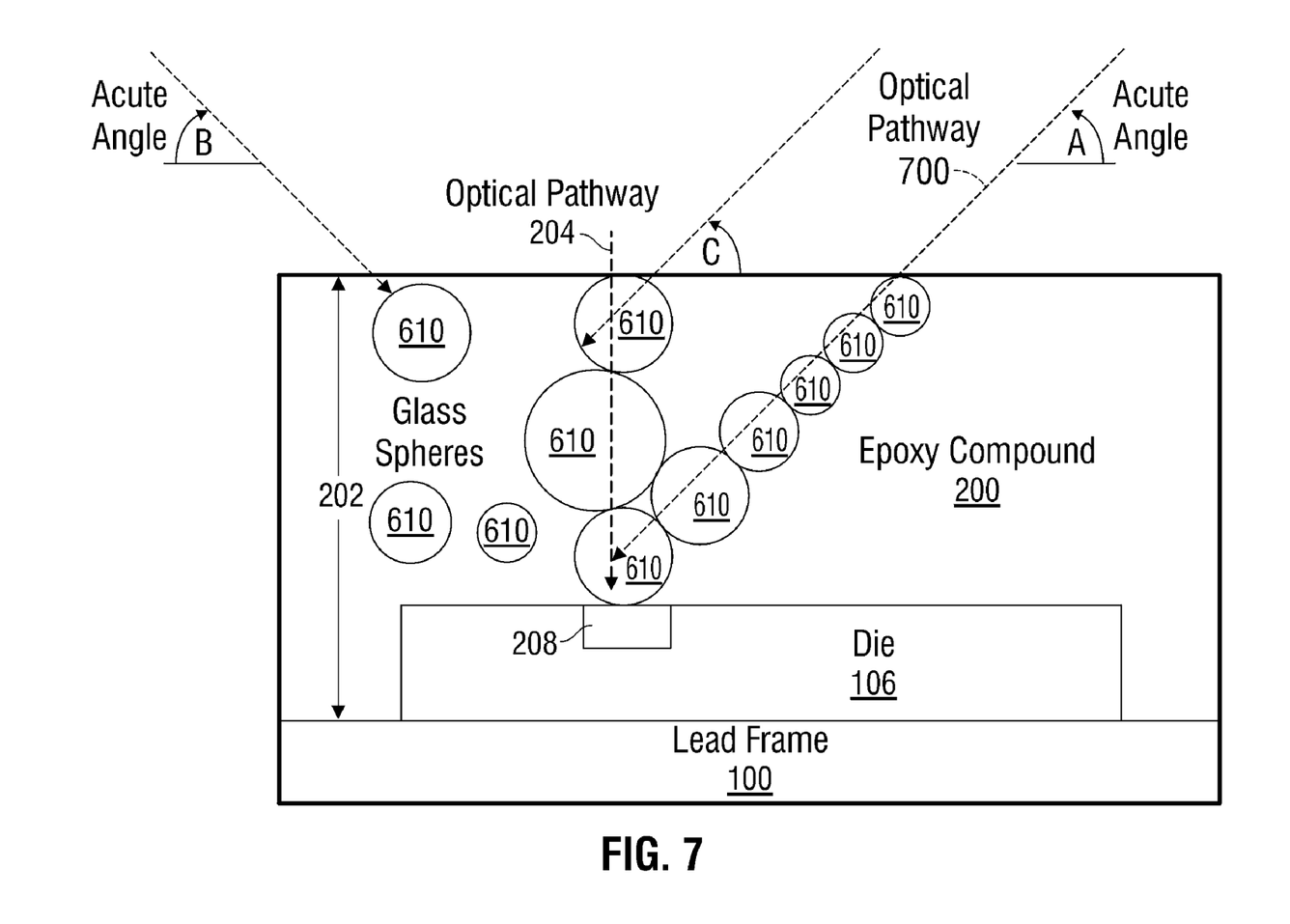
FIG. 7 partial cross-sectional view of various optical pathways formed through glass beads in an epoxy compound sealant.

FIG. 7 partial cross-sectional view of various optical pathways formed through glass beads in an epoxy compound sealant. Die 106 is mounted on lead frame 100. An epoxy compound, 200 overlies the die and lead frame. The epoxy compound 200 has a thickness 202. As shown, an optical path 204 is formed through the alignment of three glass spheres 610, exposing a sensitive region 208 of die 106. It is statistically less likely that an optical path 700 is formed when, the laser beam is aligned along acute angle A. Even if an optical path is found, as shown, that path is likely to be more narrow that the right-angle path 204. Thus, less energy is imparted to die sensitive region 208. More likely, the laser beams at acute angles B and C fail to find an optical path all the way through the epoxy compound.

Figure 8:
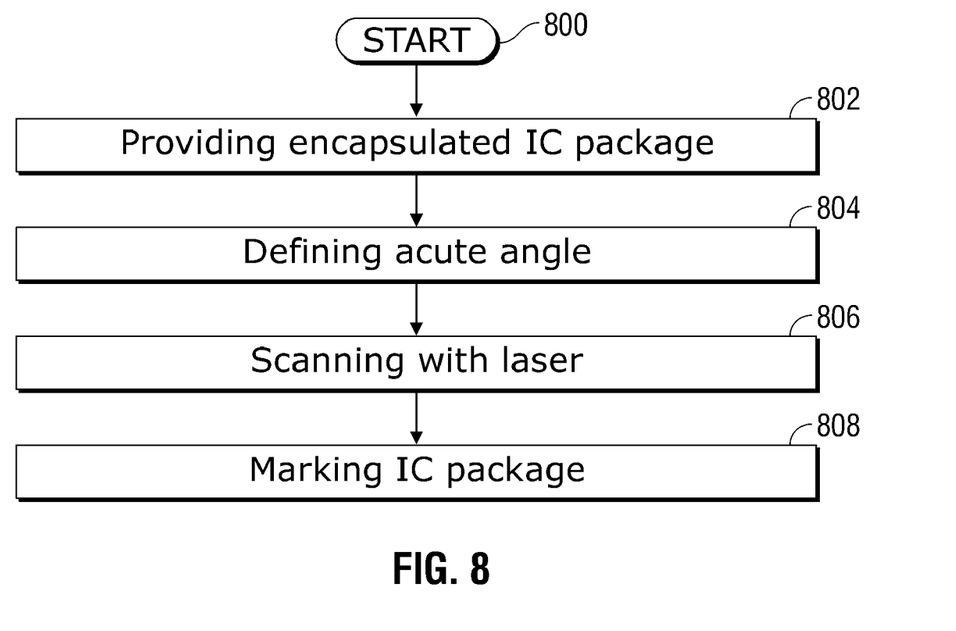
FIG. 8 is a flowchart illustrating a method for laser optically marking IC packages in a non-destructive manner.

FIG. 8 is a flowchart illustrating a method for laser optically marking IC packages in a non-destructive manner. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 provides an IC die encapsulated as a package in a compound of glass spheres and epoxy. Step 804 defines an acute angle between a laser optical path and an IC package planar surface. As defined herein, a laser beam that is normal to the IC package planar surface is at 90 degrees, or is referred to as a right angle. Step 806 scans the IC package surface with a laser. In response to ablating the IC package surface, Step 808 forms a legible mark on the IC package surface. Typically, the IC surface is ablated to a depth of about 25 microns, or greater. In another aspect, Step 808 forms an ablation mark on the IC package surface having an ablation angle equal to the acute angle.

Figure 9:
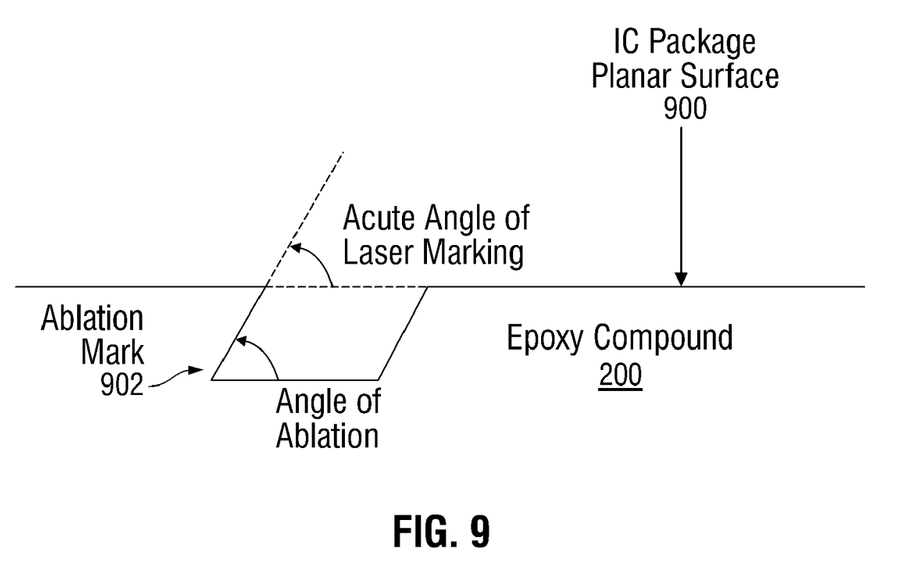
FIG. 9 is a partial cross-sectional view of an IC package surface showing an angled ablation mark.

FIG. 9 is a partial cross-sectional view of an IC package surface 900 showing an angled ablation mark 902.

Returning to FIG. 8, in one aspect scanning the IC package surface with the laser in Step 806 includes scanning with a laser having a wavelength that is minimally absorbed by the glass spheres in the epoxy compound of the IC package. Alternately, Step 806 scans with a laser having a wavelength that is substantially absorbed by the epoxy in the epoxy compound of the IC package. For example, more than 50% of the laser energy is absorbed by the epoxy. A carbon dioxide laser having a wavelength of about 10.6 microns may be used. Near Infrared lasers at wavelength of 1084 nanometers are also used.

In one aspect, providing the IC die encapsulated with the compound of glass spheres and epoxy in Step 802 includes providing an IC die encapsulating with an epoxy/glass sphere layer having a thickness of less than 300 microns. In another aspect, the glass spheres have a diameter of greater than 10 microns. These thickness and diameter dimensions make an IC package conducive to forming optical paths. However, the method described herein is not limited to any particular set of dimensions.

In one aspect, Step 802 provides an IC die encapsulated with a first thickness of compound. Then, scanning the IC package surface with, a laser in Step 806 includes scanning the laser through optical pathways, formed from consecutively aligned glass spheres in the compound, having a path length greater than the first thickness. From the point of view of a statistical average, Step 802 provides an IC package with a first plurality of optical paths having a first path length equal to the first thickness. However, a second plurality of optical paths, less than the first plurality, has a second path length greater than the first path length. Even more likely. Step 806 scans the laser without encountering any optical pathways, formed from consecutively aligned glass spheres in the compound.

In one aspect, defining the acute angle between a laser optical path and an IC package planar surface in Step 804 includes defining an angle in the range of about ±(0 to 70) degrees from the IC package planar surface. Preferably, the angle is in the range of ±(60 to 70) degrees from the IC package planar surface.

A method has been, provided for minimizing damage due to laser optical paths in an IC package. Examples of particular laser wavelengths and scanning techniques have been given to illustrate the invention. However, the invention is not limited to merely these examples. Other variations and embodiments of the invention, will occur to those skilled in the art.

I claim:

1. A method for laser optically marking integrated circuit (IC) packages in a non-destructive manner, the method comprising:

providing an IC die encapsulated as a package in a compound of glass spheres and epoxy;

defining an acute angle, exclusively in the range of ±(0 to 70) degrees, between a laser optical path and an IC package planar surface;

scanning the IC package surface with a laser; and, in response to ablating the IC package surface, forming a legible mark on the IC package surface.

2. The method of claim 1 wherein scanning the IC package surface with the laser includes scanning with a laser having a wavelength that is minimally absorbed by the glass spheres in the epoxy compound of the IC package.

3. The method of claim 1 wherein scanning the IC package surface with the laser includes scanning with carbon dioxide laser having a wavelength of about 10.6 microns.

4. The method of claim 1 wherein providing the IC die encapsulated with the compound of glass spheres and epoxy includes providing an IC die encapsulating with an epoxy/glass sphere layer having a thickness of less than 300 microns.

5. The method of claim 1 wherein providing the IC die encapsulated with the compound of glass spheres and epoxy includes providing an IC die encapsulating with an epoxy/glass sphere layer having glass spheres with a diameter of greater than 10 microns.

6. The method of claim 1 wherein providing the IC die encapsulated with the compound of glass spheres and epoxy includes providing an IC die encapsulated with a first thickness of compound; and, wherein scanning the IC package surface with a laser includes scanning the laser through optical pathways, formed from consecutively aligned glass spheres in the compound, having a path length greater than the first thickness.

7. The method of claim 1 wherein providing the IC die encapsulated with the compound of glass spheres and epoxy includes providing an IC package with a first plurality of optical paths having a first path length equal to the first thickness, and a second plurality of optical paths, less than the first plurality, having a second path length greater than the first path length.

8. The method of claim 1 wherein defining the acute angle includes defining an angle in the range of ±(60 to 70) degrees from the IC package planar surface.

9. The method of claim 1 wherein forming the legible mark in response to ablating the IC surface includes ablating the IC package surface to a depth of about 25 microns, or greater.

10. The method of claim 1 wherein scanning the IC package surface with the laser includes scanning with a laser having a wavelength that is substantially absorbed by the epoxy in the epoxy compound of the IC package.

11. The method of claim 1 wherein scanning the IC package surface with a laser includes scanning the laser without encountering any optical pathways, formed from consecutively aligned glass spheres in the compound.

12. A method for laser optically marking integrated circuit (IC) packages in a non-destructive manner, the method comprising:

providing an IC die encapsulated as a package in a compound of glass spheres and epoxy;

defining only a first acute angle between a laser optical path and an IC package planar surface;

scanning the IC package surface with a laser; and, forming an ablation mark on the IC package surface having an ablation angle equal to the first acute angle.

* * * * *